(12) United States Patent
Osada et al.

(10) Patent No.: US 7,732,836 B2
(45) Date of Patent: Jun. 8, 2010

(54) COMPOUND SEMICONDUCTOR EPITAXIAL SUBSTRATE AND METHOD FOR MANUFACTURING THE SAME

(75) Inventors: Takenori Osada, Ichihara (JP); Tsuyoshi Nakano, Ichihara (JP); Takayuki Inoue, Sodegaura (JP)

(73) Assignees: Sumitomo Chemical Company, Limited, Tokyo (JP); Sumika Epi Solution Company, Ltd., Tokyo (JP)

( * ) Notice: Subject to any disclaimer, the term of this patent is extended or adjusted under 35 U.S.C. 154(b) by 0 days.

(21) Appl. No.: 10/540,513

(22) PCT Filed: Dec. 19, 2003

(86) PCT No.: PCT/JP03/16395

§ 371 (c)(1),
(2), (4) Date: Jun. 23, 2005

(87) PCT Pub. No.: WO2004/059744

PCT Pub. Date: Jul. 15, 2004

(65) Prior Publication Data

US 2006/0113563 A1 Jun. 1, 2006

(30) Foreign Application Priority Data

Dec. 25, 2002 (JP) .............................. 2002-374547

(51) Int. Cl.
*H01L 29/778* (2006.01)
(52) U.S. Cl. ............... 257/194; 257/192; 257/E29.246; 257/E29.247; 257/E29.248
(58) Field of Classification Search .............. 257/194, 257/E29.246, 192, E29.247, E29.248
See application file for complete search history.

(56) References Cited

U.S. PATENT DOCUMENTS 5,404,032 A * 4/1995 Sawada et al. .............. 257/192

(Continued)

FOREIGN PATENT DOCUMENTS

JP 63-137413 A 6/1988

(Continued)

OTHER PUBLICATIONS

Osamu Ishikawa, Katsunori NIshii, Toshinobu Matsuno, Chinatsu Azuma, Yoshito Ikeda, Syutaro Nanbu and Kaoru Inoue, Low Noise InGaAs HEMT Using the New Off-Set Recess Gate Process, 1989, IEEE MTT-S Digest, pp. 979-982.*

(Continued)

*Primary Examiner*—Davienne Monbleau
*Assistant Examiner*—Eduardo A Rodela
(74) *Attorney, Agent, or Firm*—Sughrue Mion, PLLC

(57) ABSTRACT

In a compound semiconductor epitaxial substrate used for a strain channel high electron mobility field effect transistor which comprises an InGaAs layer as a channel layer 9 and AlGaAs layers containing n-type impurities as electron supplying layers 6 and 12, the channel layer 9 has an electron mobility at room temperature of 8300 $cm^2/V \cdot s$ or more by adjusting an In composition of the InGaAs layer composing the channel layer 9 to 0.25 or more and optimizing the In composition and the thickness of the channel layer 9. GaAs layers 8 and 10 having a thickness of 4 nm or more each may be laminated respectively in contact with a top surface and a bottom surface of the channel layer 9.

3 Claims, 4 Drawing Sheets

U.S. PATENT DOCUMENTS 5,751,027 A * 5/1998 Sawada et al. .............. 257/192
5,831,296 A * 11/1998 Kuroda et al. .............. 257/194

FOREIGN PATENT DOCUMENTS

| JP | 5-74819 A | | 3/1993 |
|---|---|---|---|
| JP | 05-226372 | * | 9/1993 |
| JP | 6-21106 A | | 1/1994 |
| JP | 6-84959 A | | 3/1994 |
| JP | 06-84959 A | | 3/1994 |
| JP | 6-163599 A | | 6/1994 |
| JP | 06-163599 A | | 6/1994 |
| JP | 8-279609 A | | 10/1996 |
| JP | 2708863 B2 | | 10/1997 |
| JP | 2001-210819 A | | 8/2001 |

OTHER PUBLICATIONS

U. Strauße et al., "Carrier mobilities in graded $In_xGa_1As/Al_{0.2}Ga_{0.8}As$ quantum wells for high electron mobility transistors", *Journal of Applied Physics*, vol. 80, No. 1, Jul. 1, 1996, pp. 322-325.

U. Strauss et al., "Carrier mobilities in graded $In_xGa_{1-x}As/Al_{0.2}Ga_{0.8}As$ quantum wells for high electron mobility transistors", *J. Appl. Phys.*, vol. 80, No. 1, Jul. 1, 1996, pp. 322-325.

J.W. Matthews et al., "Defects in Epitaxial Multilayers", *Journal of Crystal Growth*, vol. 27, 1974, pp. 118-125.

J.W. Matthews et al., "Defects in Epitaxial Multilayers", *Journal of Crystal Growth*, vol. 32, No. 2, 1976, pp. 265-273.

Yohei Otoki, "Compound Semiconductor Materials for Electronic Devices", *The Semiconductor Industry News Forum: "Compound Semiconductor, Materials Head into Mass Production Stages ②"*, Jun. 5, 2002, pp. 1, 7-8, with English Abstract.

* cited by examiner

FIG. 1

| | |
|---|---|
| i- GaAs   20nm | 14 |
| i- $Al_{0.22}Ga_{0.78}As$   3nm | 13 |
| n- $Al_{0.24}Ga_{0.76}As$   10nm   $3E18/cm^3$ | 12 |
| i- $Al_{0.24}Ga_{0.76}As$   3nm | 11 |
| i-GaAs   6nm | 10 |
| i- $In_{0.30}Ga_{0.70}As$   7.5nm | 9 |
| i-GaAs   6nm | 8 |
| i- $Al_{0.24}Ga_{0.76}As$   3nm | 7 |
| n- $Al_{0.24}Ga_{0.76}As$   4nm   $3E18/cm^3$ | 6 |
| i-$Al_{0.25}Ga_{0.75}As$   200nm | 5 |
| i-GaAs   250nm | 4 |
| i-$Al_{0.25}Ga_{0.75}As$   250nm | 3 |
| i-GaAs   200nm | 2 |
| GaAs SINGLE CRYSTAL SUBSTRATE | 1 |

| | |
|---|---|
| i-GaAs  20nm | 34 |
| i-Al$_{0.22}$Ga$_{0.78}$As  3nm | 33 |
| n-Al$_{0.24}$Ga$_{0.76}$As  10nm  3E18/cm$^3$ | 32 |
| i-Al$_{0.24}$Ga$_{0.76}$As  3nm | 31 |
| i-GaAs  6nm | 30 |
| i-In$_{0.35}$Ga$_{0.65}$As  5.5nm | 29 |
| i-GaAs  6nm | 28 |
| i-Al$_{0.24}$Ga$_{0.76}$As  3nm | 27 |
| n-Al$_{0.24}$Ga$_{0.76}$As  4nm  3E18/cm$^3$ | 26 |
| i-Al$_{0.25}$Ga$_{0.75}$As  200nm | 25 |
| i-GaAs  250nm | 24 |
| i-Al$_{0.25}$Ga$_{0.75}$As  250nm | 23 |
| i-GaAs  200nm | 22 |
| GaAs SINGLE CRYSTAL SUBSTRATE | 21 |

FIG. 4

| | |
|---|---|
| i-GaAs   20nm | 54 |
| i-Al$_{0.22}$Ga$_{0.78}$As   7nm | 53 |
| n-Al$_{0.24}$Ga$_{0.76}$As   10nm   3E18/cm$^3$ | 52 |
| i-Al$_{0.24}$Ga$_{0.76}$As   3nm | 51 |
| i-GaAs   2nm | 50 |
| i-In$_{0.20}$Ga$_{0.80}$As   13.5nm | 49 |
| i-GaAs   2nm | 48 |
| i-Al$_{0.24}$Ga$_{0.76}$As   3nm | 47 |
| n-Al$_{0.24}$Ga$_{0.76}$As   4nm   3E18/cm$^3$ | 46 |
| i-Al$_{0.25}$Ga$_{0.75}$As   200nm | 45 |
| i-GaAs   250nm | 44 |
| i-Al$_{0.25}$Ga$_{0.75}$As   250nm | 43 |
| i-GaAs   200nm | 42 |
| GaAs SINGLE CRYSTAL SUBSTRATE | 41 |

…

COMPOUND SEMICONDUCTOR EPITAXIAL SUBSTRATE AND METHOD FOR MANUFACTURING THE SAME

TECHNICAL FIELD

The present invention relates to a compound semiconductor epitaxial substrate used for a pseudomorphic high electron mobility field effect transistor composed of a III-V compound semiconductor, and a method for manufacturing the same.

BACKGROUND ART

An electronic device utilizing a GaAs III-V compound semiconductor has actively applied to an ultra-high speed transistor, taking advantage of features such as an ability to operate at an ultra-high speed and at a higher frequency because of its high electron mobility, and has recently been used practically as various essential components of high-frequency communication instruments such as a cell phone because of its advantage of low power consumption.

As the above described ultra-high speed transistor, a high electron mobility field effect transistor (referred to as a HEMT, hereinafter) has been well known. The HEMT is also referred to as a high electron mobility transistor, a modulation doped field effect transistor (MODFET), or a hetero-junction field effect transistor (HJFET).

The HEMT is principally characterized by adopting a selective doped hetero structure which is composed of an electron supplying layer for supplying electrons (a doped layer) and a channel layer through which electrons run, these layers being made of different materials. In this hetero structure, electrons supplied from n-type impurities within the electron supplying layer are pooled in a potential well formed at a channel side of a hetero-junction interface due to a difference of electron affinity between materials constituting the hetero junction to form a two-dimensional electron gas. Since n-type impurities supplying electrons are present in the electron supplying layer while electrons are present in a high purity channel as described above so that the ionized impurities and the electrons are spatially separated from each other, the two-dimensional electron gas within the channel is hardly scattered by the ionized impurities, and consequently a high electron mobility is realized.

The HEMT has usually been fabricated by using an epitaxial substrate in which thin film crystal layers respectively having predetermined electronic characteristics are laminated and grown on a GaAs single crystal substrate so as to have a predetermined structure. It is important for the HEMT to have a high electron mobility in the channel. Therefore, since it has been required to precisely control the thin film crystal layer forming the HEMT structure on the order of monoatomic layer level, a molecular beam epitaxy (referred to as a MBE method, hereinafter) or a metalorganic chemical vapor deposition (referred to as a MOCVD method, hereinafter) has conventionally been used as a method for manufacturing an epitaxial substrate having a HEMT structure.

It has been said that the MBE method, which is one of the vacuum evaporation methods, is excellent in the layer thickness and interface controllability, while this MBE method is inferior in the mass-productivity. On the contrary, the MOCVD method uses an organometallic compound or a hydride of atomic species constituting an epitaxial layer as a source material and then pyrolyzes the source material on the single crystal substrate to grow a crystal thereof, so that this method is applicable to a wide range of substances used as the source materials and has a feature of extremely extensively and precisely controlling the composition and thickness of the epitaxial crystal, and consequently this method is suitable for the purpose of processing a large amount of substrates with the favorable reproducibility.

In addition, recent and rapid technical innovation of the MOCVD method has allowed for not only controlling of the impurity amounts but also realizing a steep hetero interface or favorable in-plane uniformity that has never been considered as possible by this method. In fact, an epitaxial substrate fabricated by the MOCVD method is in no way inferior to that fabricated by the MBE method in terms of a characteristic such as an electron mobility of the HEMT, and has commercially and widely been used.

Thus, since the HEMT is an ultra-high speed transistor utilizing a two-dimensional electron gas having a high electron mobility, an electron mobility of the channel layer which is as high as possible is favorable for obtaining a high-performance HEMT. Therefore, InGaAs has recently been used as a material for the channel layer instead of using GaAs, because InGaAs is excellent in its electron transporting characteristic as well as being capable of significantly changing its energy gap in accordance with the In composition and further capable of effectively confining the two-dimensional electrons. In addition, AlGaAs or GaAs is known as a material to be combined with InGaAs.

InGaAs has a property such that the mobility becomes higher with the increase of the In composition. Thus the transistor can be sophisticated, however, a lattice constant of InGaAs also becomes larger with the increase of the In composition, which leads to lattice misfit with the electron supplying layer or the substrate material. For this reason, a method in which crystal growth is performed in a pseudomorphic condition has been used. This method utilizes a property in which a high quality crystal layer can be fabricated without inducing lattice disorder such as dislocation although the lattice strains and elastically deformed, provided that the grown layer thickness is below a certain layer thickness referred to as a critical thickness even if the crystal growth involves the lattice misfit between materials having different lattice constants. The HEMT, in which an InGaAs strain layer is used as a channel layer, is referred to as a pseudomorphic high electron mobility field effect transistor (hereinafter, referred to as a pHEMT).

It has been known that a critical thickness of the InGaAs layer is given as a function of the In composition and the layer thickness. As for an InGaAs layer with respect to a GaAs layer for example, the critical thickness is expressed by a theoretical equation disclosed in J. Crystal Growth, 27 (1974) p. 118 and in J. Crystal Growth, 32 (1974) p. 265, and this theoretical equation has been found to be experimentally correct as a whole. In addition, JP-A-6-21106 discloses an epitaxial substrate which allows for efficient manufacture of a pHEMT having a high mobility, the epitaxial substrate having an In composition within a certain range which is further limited by using a certain relational expression based on a certain relation between an In composition and a layer thickness defined by this theoretical equation. Indeed, an InGaAs layer having an In composition of 0.20 and a layer thickness of about 13 nm has been practically used as an InGaAs strain channel layer which can be epitaxially grown without inducing a reduction in its crystallinity.

Further, it is effective to additionally reduce the scattering of two-dimensional electrons caused by ionized impurities in order to improve the mobility. Thus, a spacer layer which has the same material and composition as an electron supplying layer but to which any impurities are not added may be inserted between the electron supplying layer and the channel layer. For example, Japanese Patent No. 2708863 discloses a structure for improving a two-dimensional electron gas concentration and an electron mobility, in which a spacer layer consisting of an AlGaAs layer and a GaAs layer is inserted between an InGaAs strain layer used as a channel layer and an n-AlGaAs electron supplying layer of a pHEMT structure in order to optimize the growth conditions.

A pHEMT which uses a strain InGaAs layer as a channel layer as described above can confine a large number of two-dimensional electrons under the effective influence of quantum effect by making an In composition of the channel layer larger and making a band gap between the channel layer and the electron supplying layer or spacer layer wider, so that the pHEMT has an advantage that the improvement of electron mobility can be compatible with the high mobility.

It is well known that the electron mobility is an important parameter for improving various characteristics such as an on-resistance, a maximum current value, or a transconductance each of which is an important performance indicator of a field effect transistor. Therefore, further improvement of the electron mobility can achieve a reduction of build-up resistance (on-resistance), which leads to a reduction of power consumption. In addition, since a calorific value can be decreased by lowering the power consumption, it is possible not only to realize higher integration of a device but also to reduce the chip size, so that the number of chips manufactured from one epitaxial substrate can be increased and a degree of freedom of modular design can also be increased. From this viewpoint, it is desired to further improve the electron mobility in the case of a pHEMT which is used for various portable instruments such as a cell phone.

However, the electron mobility in the epitaxial substrate having the pHEMT structure has not yet reached a satisfactory level, in view of possibility that the characteristics of the transistor can be further improved by increasing the two-dimensional electron gas concentration and the electron mobility simultaneously. For example, as described in "Compound Semiconductor, Materials Head into Mass Production Stages (2)"—Compound Semiconductor Materials for Electronic Devices—, Yohei Otoki and in Semiconductor Industry News Forum "All about Compound Semiconductors 2002—Movement of Optical High Frequency Devices toward Reemerge", Jun. 5, 2002, Myoujin Kaikan, Ochanomizu, Tokyo, a maximum value of the electron mobility in the channel layer at room temperature (300K) which had been reported with respect to the pHEMT structure epitaxial substrate was about 8170 $cm^2/V \cdot s$ at a two-dimensional electron concentration of $2.06 \times 10^{12}/cm^2$, and about 7970 $cm^2/V \cdot s$ at a two-dimensional electron concentration of $2.77 \times 10^{12}/cm^2$.

The electron mobility in the two-dimensional electron gas at room temperature (300K) has been considered to be determined by the scattering due to a crystal lattice and the effective mass of the GaAs electrons. Thus, if a strain InGaAs layer is used as a channel layer to which In is added, it is expected that the effective mass of electrons decreases and the electron mobility increases, but on the contrary, there is concern that an increase in alloy scattering due to In and Ga may result in a reduction in the electron mobility. Further, the effective mass of electrons has been considered to develop anisotropy along a vertical direction and a horizontal direction with respect to a two-dimensional electron gas plane, and there has not yet been reported an effective mass along the horizontal direction which is practically important. Thus, under the present circumstances, any measures have not been taken which ensure a reduction of the effective mass of electrons and the improvement of electron mobility.

On the other hand, it has already been reported that InGaAs which has lattice-matched with an InP single crystal substrate to be used has an electron mobility of 10000 $cm^2/V \cdot s$ at room temperature. In addition, the so-called metamorphic technology has recently been developed for forming a buffer layer whose lattice constant is near a lattice constant of InP by changing a lattice constant of the buffer layer to a lattice constant of InP in stages, provided that an InAlAs is used as a buffer layer on the GaAs single crystal substrate and an In mixed crystal ratio is changed in stages. An electron mobility exceeding 9000 $cm^2/V \cdot s$ has been reported by forming a modulation doped structure having an InGaAs layer as a channel on the buffer layer formed by using this technology. That is, InGaAs without strain channel allows for a higher electron mobility which exceeds GaAs and is consistent with a low electron effective mass thereof.

When a high-performance transistor having a high electron mobility such as exceeding 8200 $cm^2/V \cdot s$ is achieved as described above, it is necessary to use an InP single crystal substrate or to laminate a special buffer layer on a GaAs single crystal substrate in accordance with the above described metamorphic technology. However, if the InP single crystal substrate is used, it is necessary to use an epitaxial substrate having a modulation doped structure comprising as a channel layer an InGaAs layer being lattice-matched with InP and as an electron supplying layer an InAlAs layer being lattice-matched with this channel layer. For this reason, source material cost becomes extremely high when an InP single crystal substrate is used. On the other hand, even the metamorphic technology to be used, in which a thick buffer layer is formed, has a problem that the production cost becomes larger and also a new material processing technology which is different from that in the case of conventional GaAs material is required, and further has a problem that a low reliability is provided due to a high crystal defect density in the buffer layer.

Thus, in the pHEMT structure epitaxial substrate which uses an n-AlGaAs layer as an electron supplying layer and a strain InGaAs layer as a channel layer, a further improved epitaxial substrate is strongly desired which has a higher two-dimensional electron gas concentration together with a higher electron mobility compared with the currently reported values.

DISCLOSURE OF THE INVENTION

An object of the present invention is to provide an epitaxial substrate used for a pHEMT having a high electron mobility essential to achieve the above described various necessary characteristics and a method for manufacturing the same.

The present inventors have devoted ourselves to solve the above described problems, and have consequently found that an epitaxial substrate used for a pHEMT structure in which an In composition and a thickness of an InGaAs channel layer are optimized and further a thickness of a spacer layer comprising an AlGaAs layer or a GaAs layer provided between the InGaAs channel layer and an n-AlGaAs electron supplying layer is optimized has a higher electron mobility together with a higher two-dimensional electron gas concentration which have never been reported before, and have now achieved the present invention based on such findings.

According to a first aspect of the present invention, there is provided a compound semiconductor epitaxial substrate used for a strain channel high electron mobility field effect transistor, comprising an InGaAs layer as a strain channel layer and an AlGaAs layer containing n-type impurities as an electron supplying layer, wherein the InGaAs layer has an electron mobility at room temperature of 8300 cm$^2$/V·s or more. A two-dimensional electron gas concentration in the above described strain channel layer at room temperature may be 2.20×10$^{12}$/cm$^2$ or more.

According to a second aspect of the present invention, there is provided the compound semiconductor epitaxial substrate as described in the above first aspect, wherein the InGaAs layer comprising the above described strain channel layer was an In composition of 0.25 or more.

According to a third aspect of the present invention, there is provided the compound semiconductor epitaxial substrate as described in the above second aspect, wherein GaAs layers having a thickness of 4 nm or more each are laminated on the above described strain channel layer respectively in contact with a top surface and a bottom surface of the above described strain channel layer.

According to a fourth aspect of the present invention, there is provided a method for manufacturing the compound semiconductor epitaxial substrate as described in the above first, second, or third aspect, comprising epitaxially growing respective compound semiconductor layers employing a metalorganic chemical vapor deposition (MOCVD) method.

BRIEF DESCRIPTION OF THE DRAWINGS

FIG. 1 is a drawing showing a layer structure of an epitaxial substrate according to Example 1 of the present invention;

FIG. 4 is a drawing showing a layer structure of an epitaxial substrate according to Comparative Example 1 of the present invention.

BEST MODE FOR CARRYING OUT THE INVENTION

Figure 2:
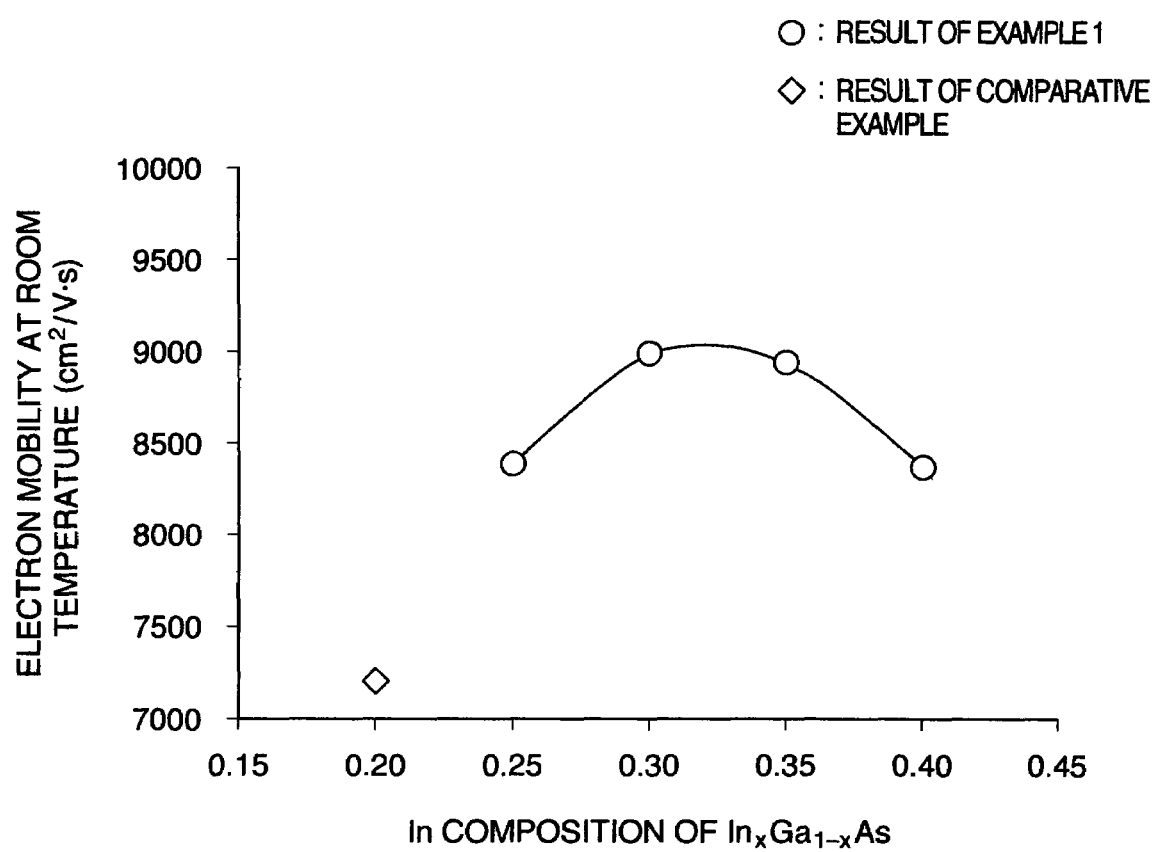
FIG. 2 is a graph of experimental results for showing an effect of the present invention, and showing a relation between an In composition of the channel layer and an electron mobility in the channel layer at room temperature.

One example of the present invention will now be described in detail with reference to the drawings.

FIG. 1 is a drawing for describing a cross-sectional structure of a first example of a HEMT structure epitaxial substrate according to the present invention. In FIG. 1, a reference numeral 1 denotes a GaAs single crystal substrate which is a single crystal substrate and each of reference numerals 2 to 5 denotes a buffer layer laminated on the GaAs single crystal substrate 1. The buffer layers 2 to 5 herein are laminated respectively as an i-GaAs layer having a thickness of 200 nm, an i-Al$_{0.25}$Ga$_{0.75}$As layer having a thickness of 250 nm, an i-GaAs layer having a thickness of 250 nm, and an i-Al$_{0.25}$Ga$_{0.75}$As layer having a thickness of 200 nm.

Reference numeral 6 denotes a back side electron supplying layer formed as an n-Al$_{0.24}$Ga$_{0.76}$As layer having a thickness of 4 nm and doped with n-type impurities at a concentration of 3×10$^{18}$/cm$^3$. Back side spacer layers 7 and 8 are formed in this order on the back side electron supplying layer 6. The back side spacer layer 7 herein is an i-Al$_{0.24}$Ga$_{0.76}$As layer having a thickness of 3 nm and the back side spacer layer 8 is an i-GaAs layer having a thickness of 6 nm. Reference numeral 9 denotes a channel layer in which two-dimensional electron gases are formed in order to flow two-dimensional electrons therethrough, and is an i-In$_{0.30}$Ga$_{0.70}$As layer having a thickness of 7.5 nm.

Each of reference numerals 10 and 11 denotes a front side spacer layer, the front side spacer layer 10 being an i-GaAs layer having a thickness of 6 nm and the front side spacer layer 11 being an i-Al$_{0.24}$Ga$_{0.76}$As layer having a thickness of 3 nm.

Reference numeral 12 denotes a front side electron supplying layer formed as an n-Al$_{0.24}$Ga$_{0.76}$As layer having a thickness of 10 nm and doped with n-type impurities at a concentration of 3×10$^{18}$/cm$^3$. Reference numerals 13 and 14 denote undoped layers which are formed as an i-Al$_{0.22}$Ga$_{0.78}$As layer having a thickness of 3 nm and an i-GaAs layer having a thickness of 20 nm respectively.

Since the epitaxial substrate shown in FIG. 1 is laminated and grown as described above, electrons are supplied from the back side electron supplying layer 6 to the channel layer 9 through the back side spacer layers 7 and 8, as well as supplying electrons from the front side electron supplying layer 12 to the channel layer 9 through the front side spacer layers 11 and 10. Consequently, a high concentration of a two-dimensional electron gas is formed in the channel layer 9.

Since an In composition of the channel layer 9 herein is adjusted to 0.3 which is larger than 0.25 and further a thickness of the channel layer 9 is adjusted to 7.5 nm in order to optimize the In composition and the thickness of the channel layer 9, the two-dimensional electron gas concentration within the channel layer 9 can be increased in addition to being capable of dramatically improving the electron mobility of the two-dimensional electron gas compared with the prior art. Consequently, even when a two-dimensional electron gas concentration in the channel layer 9 at room temperature (300K) is adjusted to 2.20×10$^{12}$/cm$^2$ or more, an electron mobility at this concentration can be at least 8300 cm$^2$/V·s or more.

Although the embodiment shown in FIG. 1 has been described with respect to a structure in which an In composition of the channel layer 9 made of an InGaAs strain channel layer is 0.3 by way of example, a relation as shown in FIG. 2 was obtained as a result of investigating a relation between the In composition and the electron mobility of the channel layer while adjusting the In composition to various levels so that the channel layer thickness became optimum. In the measurement shown in FIG. 2, a thickness of the channel layer 9 was adjusted to about 80% of a critical layer thickness which was determined from a theoretical equation described in J. Crystal Growth, 27 (1974) p. 118 and J. Crystal Growth, 32 (1974) p. 265 by using the In composition of the channel layer 9. When an In composition of the channel layer 9 was 0.25 or more, a thickness of the channel layer 9 was 10.5 nm or less. In addition, a two-dimensional electron concentration at each datum point as shown in FIG. 2 was adjusted to (2.2 to 2.4)×10$^{12}$/cm$^2$.

As described above, in a pHEMT structure in which a channel layer made of a non-doped InGaAs layer and an electron supplying layer made of an AlGaAs layer containing n-type impurities are epitaxially grown, it has been confirmed that a two-dimensional electron gas concentration can be increased in addition to being capable of obtaining an electron mobility of the two-dimensional electron gas within the channel layer of 8300 cm$^2$/V·s or more at room temperature (300K) by adjusting an In composition of the channel layer to 0.25 or more and optimizing a thickness of this layer. In this case, it has been confirmed that each of GaAs layers laminated respectively in contact with a top surface and a bottom surface of the channel layer may have a thickness of 4 nm or more.

Then, a method for fabricating the epitaxial substrate having a layer structure as shown in FIG. 1 will be described.

First, a GaAs single crystal substrate 1 is prepared. The GaAs single crystal substrate 1 is a high-resistive semi-insulating GaAs single crystal substrate, and it is favorable to use a GaAs substrate manufactured by a LEC (Liquid Encapsulated Czochralski) method, a VB (Vertical Bridgeman) method, a VGF (Vertical Gradient Freezing) method or the like. In any of these manufacturing methods, it should be provided a substrate having an angle of inclination from about 0.05° to 10° with respect to one crystallographic plane direction.

A surface of the GaAs single crystal substrate 1 prepared as described above is degreased and washed, etched, rinsed, and dry-processed, and subsequently this substrate is placed on a heating table of a crystal growth reactor. An inside of the reactor is substantially substituted with high purity hydrogen before starting a heating operation. Once a moderate and stable temperature is reached within the reactor, arsenic source materials are introduced thereto. Subsequently, gallium source materials are introduced thereto when a GaAs layer is grown. Further, gallium source materials and aluminum source materials in addition to arsenic source materials are introduced thereto when an AlGaAs layer is grown. When an InGaAs layer is grown, gallium source materials and indium source materials are introduced thereto in addition to the introduction of arsenic source materials. The desired laminated structure is being grown by controlling a supplying amount and a supplying time of each source material. Finally, the supply of respective source materials are terminated to stop the crystal growth, and after the cooling operation, the epitaxial substrate formed by the lamination as shown in FIG. 1 is removed from the reactor to complete the crystal growth. A substrate temperature at a time of growing crystals is usually from about 500° C. to 800° C.

An epitaxial substrate having a layer structure as shown in FIG. 1 can be fabricated by employing a MOCVD method. The advantage of employing the MOCVD method is that the metalorganic compounds or hydrides of atomic species constituting the epitaxial layer can be used as the source materials.

Practically, arsenic trihydride (arsine) is frequently used as an arsenic source material during the epitaxial growth, however, it is also possible to use alkyl arsine which is obtained by substituting hydrogen of arsine with an alkyl group having 1 to 4 carbon atoms. As gallium, aluminum, and indium source materials, it is generally used a trialkylate or a trihydride which is obtained by bonding an alkyl group having 1 to 3 carbon atoms or hydrogen to each metal atom.

As an n-type dopant, it is possible to use a hydride or an alkylate having an alkyl group whose carbon number is 1 to 3 of silicon, germanium, tin, sulfur, selenium or the like.

The present invention will now be described in detail based on the comparison of Examples with Comparative Example, however, the present invention is not limited to these examples.

Example 1

An epitaxial substrate having a layer structure shown in FIG. 1 was fabricated as described below by the use of a low pressure barrel-typed MOCVD reactor.

A semi-insulating GaAs single crystal substrate manufactured by the VGF method was prepared as a GaAs single crystal substrate 1, and respective compound semiconductor layers were epitaxially grown on the GaAs single crystal substrate 1. Trimethyl gallium (TMG), trimethyl aluminum (TMA), and trimethyl indium (TMI) were used as source materials of the third-group elements, while arsine ($AsH_3$) was used as a source material of the fifth-group element. Silicon (Si) was used as an n-type dopant. High-purity hydrogen was used as a carrier gas for the source materials, and the epitaxial growth was performed under the conditions that a pressure within the reactor was 0.1 atm, a growth temperature was 650° C., and a growth rate was 3 to 1 μM/hr.

The channel layer 9 through which electrons run was epitaxially grown in order to obtain a strain InGaAs layer having an In composition of 0.30 and a thickness of 7.5 nm.

Each of i-GaAs layers as spacer layers 8 and 10 was epitaxially grown to a thickness of 6.0 nm on a top surface and a bottom surface of the InGaAs layer used as the channel layer 9, respectively.

According to the epitaxial substrate obtained as described above, the result of performing the hall measurement in accordance with a Van der Pauw method showed better measurement values which had never been reported before, that is, a two-dimensional electron gas concentration at room temperature (300K) was $2.28 \times 10^{12}/cm^2$, an electron mobility at room temperature (300K) was 8990 cm$^2$/V·s, a two-dimensional electron gas concentration at 77K was $2.59 \times 10^{12}/cm^2$, and an electron mobility at 77K was 35600 cm$^2$/V·s. In addition, as a result of performing a CV measurement by using an Al schottky electrode with respect to this structure, a pinch-off voltage at a residual carrier concentration of $1 \times 10^{15}/cm^3$ was −1.93 V.

Example 2

Figure 3:
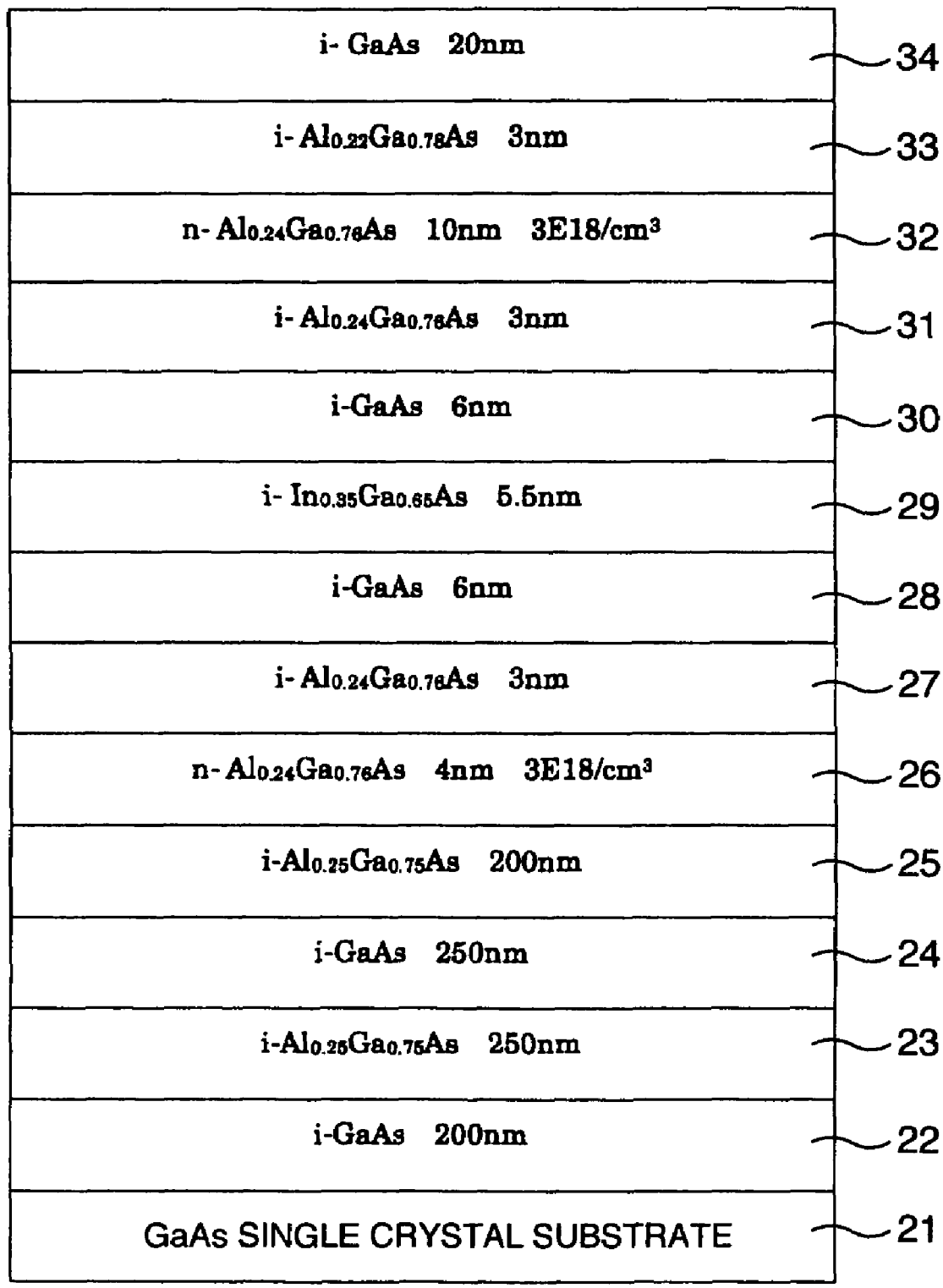
FIG. 3 is a drawing showing a layer structure of an epitaxial substrate according to Example 2 of the present invention.

An epitaxial substrate having a layer structure shown in FIG. 3 was fabricated in accordance with the MOCVD method as in the case of Example 1. In the epitaxial substrate shown in FIG. 3, a reference numeral 21 denotes a semi-insulating GaAs single crystal substrate, reference numerals 22 to 25 denote buffer layers, a reference numeral 26 denotes a back side electron supplying layer, reference numerals 27 and 28 denote back side spacer layers, a reference numeral 29 denotes a channel layer, reference numerals 30 and 31 denote front side spacer layers, a reference numeral 32 denotes a front side electron supplying layer, a reference numeral 33 denotes an undoped AlGaAs layer, and a reference numeral 34 denotes an undoped GaAs layer. Composition and thickness of each layer are as shown in FIG. 3.

As can be seen from comparing FIG. 3 with FIG. 1, Example 2 is different from Example 1 in that a strain InGaAs layer having an In composition of 0.35 and a thickness of 5.5 nm is epitaxially grown. Formation of other respective layers are the same as in the case of Example 1.

According to the epitaxial substrate obtained as described above, the result of performing the hall measurement in accordance with a Van der Pauw method showed favorable measurement values, that is, a two-dimensional electron gas concentration at room temperature (300K) was $2.22 \times 10^{12}/cm^2$, an electron mobility at room temperature (300K) was 8950 cm$^2$/V·s, a two-dimensional electron gas concentration at 77K was $2.22 \times 10^{12}/cm^2$, and an electron mobility at 77K was 33000 cm$^2$/V·s. In addition, as a result of performing a CV measurement by using an Al schottky electrode with respect to this structure, a pinch-off voltage at a residual carrier concentration of $1 \times 10^{15}/cm^3$ was −1.75 V.

Comparative Example

As for a pHEMT structure epitaxial substrate, an epitaxial substrate having a structure shown in FIG. 4 was fabricated by employing the MOCVD method in the same way as above, except only for making modifications to an In composition and a thickness of the strain InGaAs layer used for the channel layer and to a thickness of the i-GaAs layers laminated on the top and bottom surfaces of this channel layer. In the epitaxial substrate shown in FIG. 4, a reference numeral 41 denotes a semi-insulating GaAs single crystal substrate, reference numerals 42 to 45 denote buffer layers, a reference numeral 46 denotes a back side electron supplying layer, reference numerals 47 and 48 denote back side spacer layers, a reference numeral 49 denotes a channel layer, reference numerals 50 and 51 denote front side spacer layers, a reference numeral 52 denotes a front side electron supplying layer, a reference numeral 53 denotes an undoped AlGaAs layer, and a reference numeral 54 denotes an undoped GaAs layer. Composition and thickness of respective layers are as shown in FIG. 4.

As can be seen from comparing FIG. 4 with FIG. 3, Comparative Example is different from a structure shown in FIG. 3 (Example 2) in that the channel layer 49 has an In composition of 0.20 and a thickness of 13.5 nm, and that a thickness of each of i-GaAs layers serving as a spacer layer and provided on a top surface and a bottom surface of the channel layer 49 is 2.0 nm, respectively. The structure of Comparative Example as shown in FIG. 4 represents a pHEMT structure which has conventionally been well known.

As for the epitaxial substrate obtained as described above, the result of performing the hall measurement in accordance with a Van der Pauw method showed that the measurement values were almost the same as values which had been reported before, that is, a two-dimensional electron gas concentration at room temperature (300K) was $2.55 \times 10^{12}/cm^2$, an electron mobility at room temperature (300K) was 7200 $cm^2/V \cdot s$, a two-dimensional electron gas concentration at 77K was $2.78 \times 10^{12}/cm^2$, and an electron mobility at 77K was 21900 $cm^2/V \cdot s$. In addition, as a result of performing a CV measurement by using an Al schottky electrode with respect to this structure, a pinch-off voltage at a residual carrier concentration of $1 \times 10^5/cm^3$ was −2.12 V.

Each of the layer structures of the epitaxial substrates from Examples and Comparative Example is a test structure for evaluating the mobility following the Hall measurement and for evaluating the two-dimensional electron gas characteristics such as the threshold voltage measurement following the CV measurement. In a layer structure of an actual epitaxial substrate used for fabricating a FET device, a thickness of a non-doped GaAs layer corresponding to the fourteenth layer in the layer structure of the epitaxial substrate from Examples and Comparative Example is increased, and in addition, contact layers are laminated for achieving ohmic contacts with a source electrode and a drain electrode. As the contact layer, it is usually used an n-GaAs layer which is doped with silicon at a concentration about $3 \times 10^{18}$ to $5 \times 10^{18}/cm^3$ and laminated to a thickness of about 100 nm. However, the effect of improving the mobility according to the present invention is never compromised by a process for growing the contact layers and for fabricating the FET device. The effect of improving the mobility according to the present invention is significant not only in the test structures for evaluating the characteristics of epitaxial substrates from Examples Comparative Example, but also in a structure of an epitaxial substrate used for the FET device.

High electron mobility which can be achieved for the first time in a strain InGaAs channel system on a GaAs substrate according to the present invention has a significant impact on the art, because such a high electron mobility has never been obtained except in a system in which an InGaAs layer is used as a channel layer and lattice-matched with an InP substrate, or alternatively in a system in which an InGaAs layer is used as a channel layer and lattice-matched with a buffer layer having almost the same lattice constant as that of InP formed by a metamorphic technology on a GaAs substrate. That is, the present invention has an commercially significant advantage of its applicability to the conventional device processing technology without making any modifications, because the present invention requires neither an InP substrate which is expensive and hard to deal with nor a special metamorphic buffer technology and because an electron supplying layer or buffer layer is basically the same as that of the conventional pHEMT.

In addition, since application of the HEMT is controlled by an electron velocity which is closely correlated with the electron mobility, a pHEMT which uses a GaAs substrate of the present invention is to open up new possibilities for realizing various high-speed devices operated within an ultra high frequency band from several tens of GHz to several hundreds of GHz, in which the realization of the pHEMT using a GaAs substrate of the present invention has been said to be difficult unless an InP substrate is used or a metamorphic technology is used. For this reason, the present invention is to bring a great deal of advantages to the art.

INDUSTRIAL APPLICABILITY

According to the present invention, there is provided a compound semiconductor epitaxial substrate having a pHEMT (strain channel high electron mobility field effect transistor) structure with the favorable characteristics which have never been reported before and being advantageous to the fabrication of electronic devices, as described above.

The invention claimed is:

1. A compound semiconductor epitaxial substrate for use in a strain channel high electron mobility field effect transistor, comprising an InGaAs layer as a strain channel layer and an AlGaAs layer containing n-type impurities as an electron supplying layer, wherein said InGaAs layer has an electron mobility at room temperature of 8300 $cm^2/V \cdot s$ or more,
    wherein undoped GaAs layers having a thickness of 4 nm or more each are laminated respectively in contact with a top surface and a bottom surface of said strain channel layer;
    wherein at least one of said undoped GaAs layers is further in contact with an undoped AlGaAs layer; and
    wherein said AlGaAs layer containing n-type impurities is in contact with said undoped AlGaAs layer.

2. The compound semiconductor epitaxial substrate according to claim 1, wherein the InGaAs layer constituting said strain channel layer has an In composition of 0.25 or more.

3. The compound semiconductor epitaxial substrate according to claim 1, wherein the InGaAs layer constituting said strain channel layer has an In composition of 0.35 or more.

* * * * *